United States Patent
Kang et al.

(10) Patent No.: US 9,881,982 B2
(45) Date of Patent: Jan. 30, 2018

(54) ORGANIC LIGHT EMITTING DISPLAY (71) Applicant: SAMSUNG DISPLAY CO., LTD., Yongin, Gyeonggi-Do (KR)

(72) Inventors: Ki Nyeng Kang, Seoul (KR); Na-Young Kim, Seongnam-si (KR); Youn Joon Kim, Seoul (KR); Sang Jo Lee, Hwaseong-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/750,287

(22) Filed: Jun. 25, 2015

(65) Prior Publication Data
US 2016/0218162 A1 Jul. 28, 2016

(30) Foreign Application Priority Data
Jan. 22, 2015 (KR) .................. 10-2015-0010844

(51) Int. Cl.
H01L 29/08 (2006.01)
H01L 35/24 (2006.01)
H01L 51/00 (2006.01)
H01L 27/32 (2006.01)

(52) U.S. Cl.
CPC ...... H01L 27/3262 (2013.01); H01L 51/0097 (2013.01); Y02E 10/549 (2013.01)

(58) Field of Classification Search
CPC ............. H01L 27/1218; H01L 27/3248; H01L 27/3251; H01L 27/3253; H01L 27/326; H01L 27/3262; H01L 2251/5338
See application file for complete search history.

(56) References Cited

U.S. PATENT DOCUMENTS

| 9,245,934 | B2* | 1/2016 | Chung | H01L 27/3267 |
| 9,577,203 | B2* | 2/2017 | Kim | H01L 51/0097 |
| 2008/0179598 | A1* | 7/2008 | Kim | H01L 27/1251 257/59 |
| 2009/0289963 | A1* | 11/2009 | Minami | G09G 3/3233 345/690 |
| 2010/0213819 | A1* | 8/2010 | Cok | H01L 27/3255 313/498 |
| 2010/0330338 | A1 | 12/2010 | Boyce et al. | |
| 2013/0187131 | A1* | 7/2013 | Chung | H01L 27/326 257/40 |
| 2013/0222217 | A1* | 8/2013 | Shin | H01L 27/326 345/80 |

(Continued)

FOREIGN PATENT DOCUMENTS

| KR | 10-2009-0103766 A | 10/2009 |
| KR | 10-2014-0044567 A | 4/2014 |

Primary Examiner — Meiya Li
Assistant Examiner — Peter M Albrecht
(74) Attorney, Agent, or Firm — Lee & Morse, P.C.

(57) ABSTRACT

An organic light emitting display includes a substrate including a first region and a second region adjacent to the first region, a plurality of first organic light emitting elements located in the first region, a plurality of second organic light emitting elements located in the second region, and a plurality of first thin film transistors located in the second region and connected to the first organic light emitting elements in the first region to drive the first organic light emitting elements. The first thin film transistors do not overlap with the first organic light emitting elements.

13 Claims, 9 Drawing Sheets (56) References Cited

U.S. PATENT DOCUMENTS

| | | | |
|---|---|---|---|
| 2014/0145161 A1 | 5/2014 | Naijo | |
| 2014/0300529 A1* | 10/2014 | Kim | H01L 27/326 345/80 |
| 2014/0353613 A1* | 12/2014 | Cheon | H01L 51/0097 257/40 |
| 2014/0361262 A1* | 12/2014 | Kim | H01L 27/3218 257/40 |
| 2015/0287747 A1* | 10/2015 | Cheng | G02F 1/1362 257/72 |
| 2016/0307528 A1* | 10/2016 | Zou | G02F 1/136286 |
| 2017/0125501 A1* | 5/2017 | Lim | H01L 27/3262 |

\* cited by examiner

ORGANIC LIGHT EMITTING DISPLAY

CROSS-REFERENCE TO RELATED APPLICATION

Korean Patent Application No. 10-2015-0010844, filed on Jan. 22, 2015, in the Korean Intellectual Property Office, and entitled: "Organic Light Emitting Display," is incorporated by reference herein in its entirety.

BACKGROUND

1. Field

Embodiments relate generally to an organic light emitting display that is bendable.

2. Description of the Related Art

Flat panel displays (FPDs) include an organic light emitting display (OLED), a liquid crystal display (LCD), and a plasma display panel (PDP).

SUMMARY

Embodiments are directed to an organic light emitting display, including a substrate including a first region and a second region adjacent to the first region, a plurality of first organic light emitting elements located in the first region, a plurality of second organic light emitting elements located in the second region, and a plurality of first thin film transistors located in the second region and connected to the first organic light emitting elements in the first region to drive the first organic light emitting elements. The first thin film transistors do not overlap with the first organic light emitting elements.

The first region may not overlap the first thin film transistors.

The first region may be a bendable region.

The first region may extend from one lateral end to another lateral end of the substrate. The first organic light emitting elements may be in a form of three or more columns and rows.

The second region may be in a form of two second regions on the substrate. The first region is between the two second regions.

The organic light emitting display may further include a plurality of second thin film transistors located in the two second regions and connected to the second organic light emitting elements. The first thin film transistors and the second thin film transistors may overlap with at least one of the second organic light emitting elements.

Each of the first thin film transistors and the second thin film transistors may include a source electrode, a drain electrode, and a gate electrode. The drain electrode of the first thin film transistors may be longer than a drain electrode of the second thin film transistor.

The drain electrode of the first thin film transistor extends from the first region to the second region.

The first region may be a region where stress is concentrated when the organic light emitting display is bent.

The first region may include an inorganic insulating layer having openings and an organic material insulating layer that covers the openings in the inorganic insulating layer.

The first region may include a plurality of the first regions. The substrate may include a plurality of third regions, the third regions including third organic light emitting elements and third thin film transistors, the third thin film transistors overlapping with the third organic light emitting elements to drive the third organic light emitting elements.

The third region may include first thin film transistors connected to the first organic light emitting elements to drive the first organic light emitting elements.

The third regions may be between the first regions.

The first region and the third region may be bendable regions.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. Further, it will be understood that when a layer or element is referred to as being "between" two layers or elements, it can be the only layer or element between the two layers, or one or more intervening layers or elements may also be present. Like reference numerals refer to like elements throughout.

An organic light emitting display according to an exemplary embodiment will now be described in detail with reference to FIGS. 1 and 2.

Figure 1:
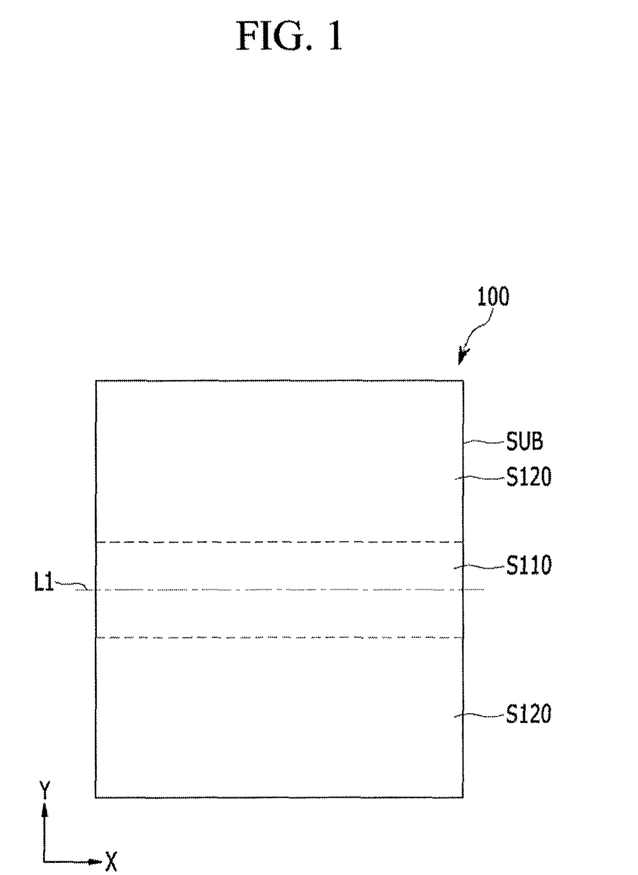
FIG. 1 illustrates a top plan view of an organic light emitting display according to a an exemplary embodiment.
Figure 2:
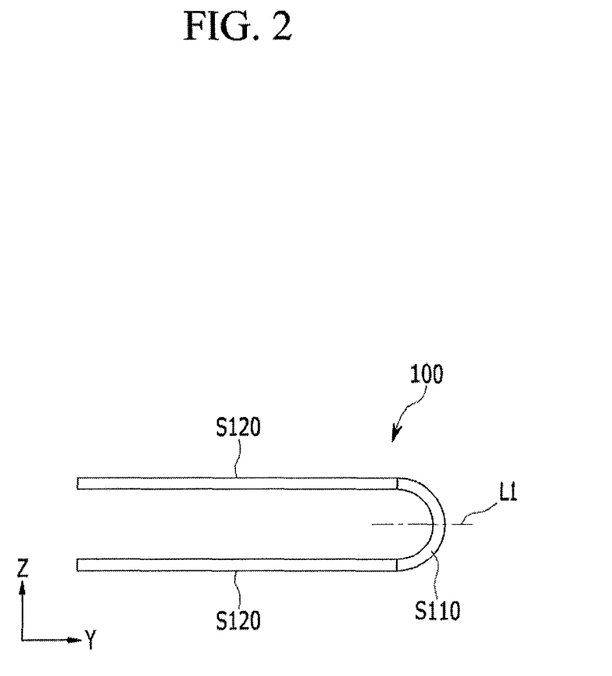
FIG. 2 illustrates a side view depicting a folded state of the organic light emitting display of FIG. 1.

FIG. 1 illustrates a top plan view of an organic light emitting display according to an exemplary embodiment, and FIG. 2 illustrates a side view depicting a folded state of the organic light emitting display of FIG. 1.

Referring to FIGS. 1 and 2 (and also FIGS. 3 to 5), an organic light emitting display 100 according to an exemplary embodiment includes: a substrate (SUB); and a plurality of first organic light emitting elements 10, a plurality of first thin film transistors TR1, a plurality of second organic light emitting elements 20, and a plurality of second thin film transistors TR2 formed on the substrate (SUB).

A first region S110 and a second region S120 adjacent to the first region S110 are formed on the substrate (SUB). The first region S110 is foldable or bendable based on a reference line L1 passing through the center of a length direction (Y-axis direction) of the substrate (SUB). As shown in FIG. 2, the first region S110 may be formed as bent regions that are symmetrical to each other based on the reference line L1. The first region S110 may be formed, for example, at the center of the length direction of the substrate (SUB). In some implementations, the first region S110 may be any region where stress is concentrated when bent.

The first region S110 may extend from one lateral end to the other lateral end along a width direction (X-axis direction) of the substrate (SUB) direction. Two second regions S120 may be formed on the substrate (SUB), and the first region S110 may be disposed between the second regions S120. The second region S120 may be fixed by a hard frame so as to not be bendable.

The organic light emitting display according to exemplary embodiments will be described more fully with reference to FIGS. 3, 4, and 5.

Figure 3:
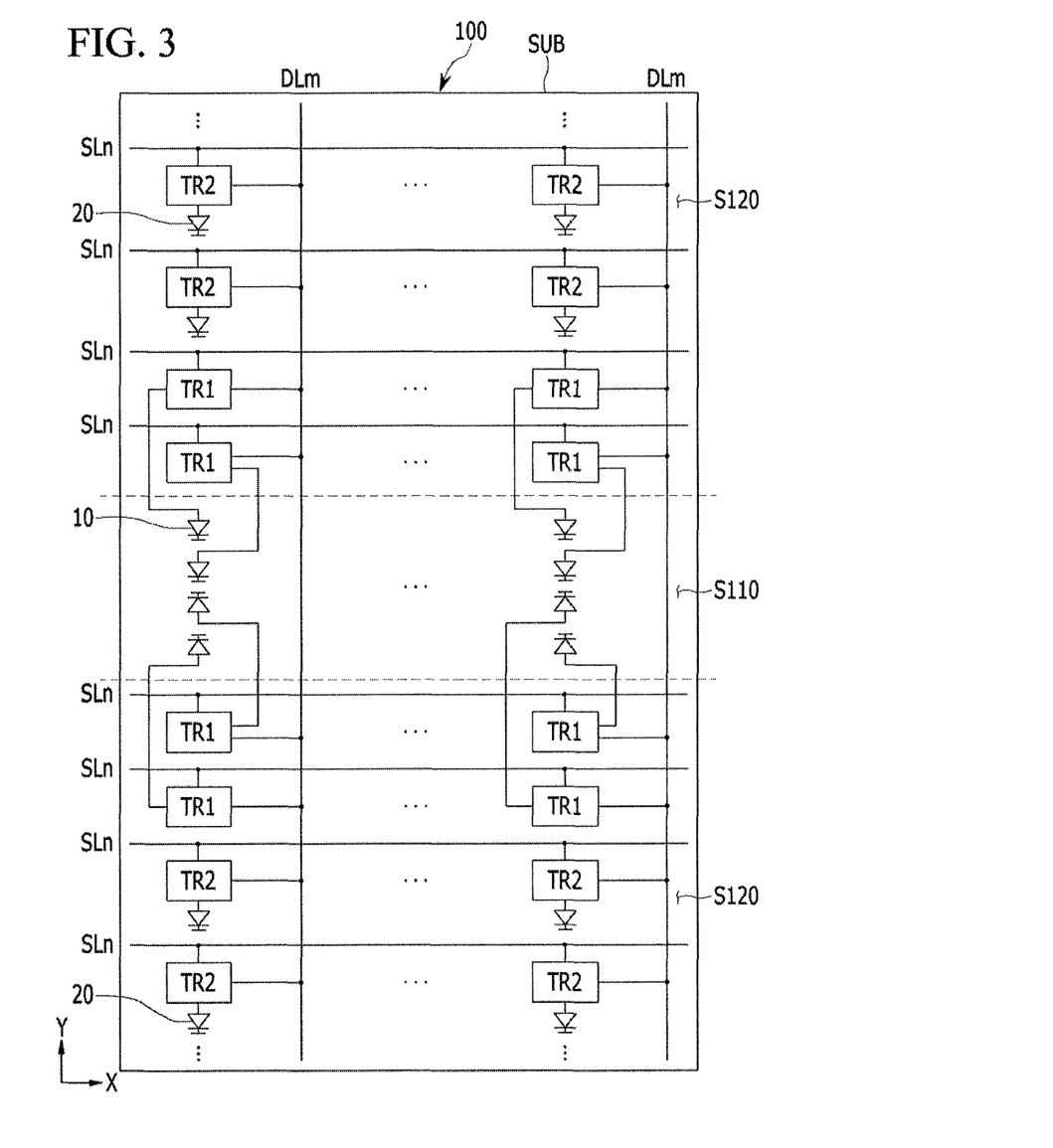
FIG. 3 illustrates a circuit diagram of the organic light emitting display according to the exemplary embodiment.
Figure 4:
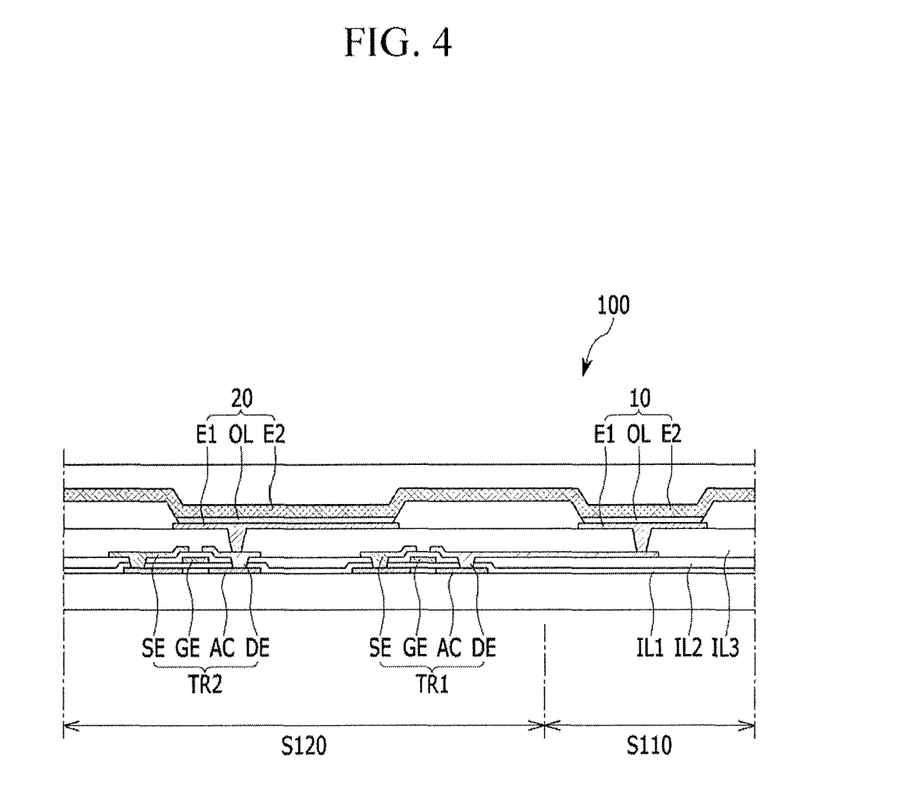
FIG. 4 illustrates a cross-sectional view of the organic light emitting display according to the exemplary embodiment.
Figure 5:
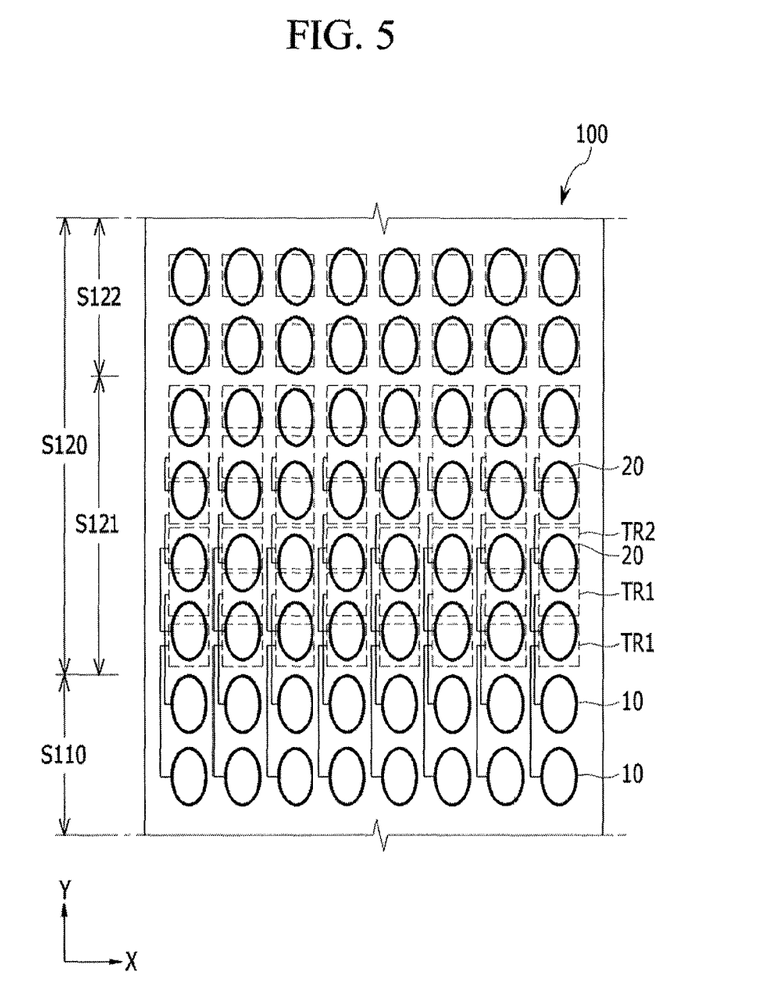
FIG. 5 illustrates an enlarged top plan view of the organic light emitting display according to the exemplary embodiment.

FIG. 3 illustrates a circuit diagram of the organic light emitting display according to this exemplary embodiment, FIG. 4 illustrates a cross-sectional view of the organic light emitting display according to this exemplary embodiment, and FIG. 5 is an enlarged top plan view of the organic light emitting display according to this exemplary embodiment.

Referring to FIG. 3, a plurality of scan lines SLn, a plurality of data lines DLm, a plurality of first organic light emitting elements 10, a plurality of first thin film transistors TR1, a plurality of second organic light emitting elements 20, and a plurality of second thin film transistors TR2 may be formed on the substrate (SUB).

The organic light emitting display 100 according to this exemplary embodiment is shown to include the substrate (SUB), the scan lines SLn, the data lines DLm, the first organic light emitting elements 10, the first thin film transistors TR1, the second organic light emitting elements 20, and the second thin film transistors TR2. In some implementations, the organic light emitting display 100 according to the this exemplary embodiment may further include a driving power line, an initial power line, a capacitor, etc.

The substrate (SUB) may have a rectangular shape in a plan view, and may be bendable in a length direction (Y-axis direction) as a direction that is parallel with long sides of the substrate (SUB). The substrate (SUB) may contain a suitable material that allows the substrate (SUB) to be bent. For example, the substrate (SUB) may contain one or more of a polymer material such as polyimide, a metal material, and an inorganic material. The substrate (SUB) may have a film shape.

The directions in which the scan lines SLn extend may vary. For example, as shown in FIG. 3, each of the scan lines SLn may extend in a horizontal direction (X-axis direction), and the scan lines SLn may be spaced apart in a vertical direction. The scan lines SLn may be connected to the thin film transistors TR1 and TR2, and the organic light emitting elements (organic light emitting diodes) may emit light depending on signals of the scan lines SLn.

The direction in which the data lines DLm extend may vary. As illustrated in FIG. 3, each of the data lines DLm may extend in a vertical direction (Y-axis direction), and the data lines DLm may be spaced apart in a horizontal direction. The data lines DLm respectively cross the scan lines SLn in an insulated manner. The data lines DLm may be connected to the thin film transistors TR1 and TR2, and the organic light emitting elements 10 and 20 may emit light depending on signals of the data lines DLm.

A cross-section structure of the organic light emitting display will be described with reference to FIG. 4.

A first thin film transistor TR1 and a second thin film transistor TR2 may have the same configuration except for being respectively disposed in different regions. Accordingly, the description of the first thin film transistor TR1 may also apply to the second thin film transistor TR2.

The first thin film transistor TR1 may include an active layer AC, a gate electrode GE, a source electrode SE, and a drain electrode DE; a first insulating layer IL1 disposed between the gate electrode GE and the active layer AC; and a second insulating layer IL2 disposed between the gate electrode GE and the source electrode SE. The source electrode SE and the drain electrode DE may be covered by a third insulating layer IL3. The drain electrode DE of the first thin film transistor TR1 may be connected to a first electrode E1 of the first organic light emitting element 10. The drain electrode DE of the first thin film transistor TR1 may be formed to be longer than the drain electrode DE of the second thin film transistor TR2. The drain electrode DE of the first thin film transistor TR1 may extend from the first region S110 to the second region S120.

Each of the first insulating layer IL1, the second insulating layer IL2, and the third insulating layer IL3 may be a laminate including at least one of an organic layer and an inorganic layer.

The active layer AC may be made of polysilicon, an oxide semiconductor, or the like. The active layer AC may include a channel region in which impurities are not doped, and a source region and a drain region formed at two respective sides of the channel region, in which impurities are doped. The impurities may vary according to a kind of thin film transistor. For example, the impurities may be N-type impurities or P-type impurities. In the case where the active layer AC is formed of an oxide semiconductor, which may be vulnerable to an external environment such as exposure at a high temperature, a separate passivation layer may be added in order to protect the oxide semiconductor.

A pixel circuit that drives an organic light emitting element may have various types of suitable configurations. For example, the pixel circuit may include a plurality of thin film transistors and one or more capacitors.

The first organic light emitting element 10 may include the first electrode E1 connected to the drain electrode DE of the first thin film transistor TR1, an organic light emitting layer OL disposed on the first electrode E1, and a second electrode E2 disposed on the organic light emitting layer OL.

The first electrode E1 may be an anode that is a hole injection electrode. The first electrode E1 may be an optically reflective electrode or an optically transmissible electrode. In some implementations, the first electrode E1 may be a cathode that is an electron injection electrode.

The organic light emitting layer OL may be disposed on the first electrode E1. The organic light emitting layer OL may be made of a low-molecule organic material or a high-molecule organic material such as poly(3,4-ethylenedioxythiophene) (PEDOT). The organic light emitting layer OL may include a red organic emission layer that emits red light, a green organic emission layer that emits green light, and a blue organic emission layer that emits blue light. The red organic emission layer, the green organic emission layer, and the blue organic emission layer may be formed in a red pixel, a green pixel, and a blue pixel, respectively, thereby realizing various color images. The organic light emitting layer OL may realize the color image by laminating the red organic emission layer, the green organic emission layer, and the blue organic emission layer together in the red pixel, the green pixel, and the blue pixel, and forming a red color filter, a green color filter, and a blue color filter for each pixel. As another example, white organic emission layers emitting white light may be formed as the organic light emitting layer OL, and a red color filter, a green color filter, and a blue color filter may be formed to provide the red pixel, the green pixel, and the blue pixel, thereby implementing the color image. In the case of implementing the color image by using the white organic emission layer as the organic light emitting layer OL and the color filters, a process of using a deposition mask to deposit the red organic emission layer, the green organic emission layer, and the blue organic emission layer on respective pixels, that is, on the red pixel, the green pixel, and the blue pixel, may be omitted. The white organic emission layer as the organic light emitting layer OL may be formed to have a single organic emission layer, and may further include a configuration in which a plurality of organic emission layers are laminated to emit white light. For example, the organic light emitting layer OL may include a configuration in which at least one yellow organic emission layer and at least one blue organic emission layer are combined to emit white light, a configuration in which at least one cyan organic emission layer and at least one red organic emission layer are combined to emit white light, and a configuration in which at least one magenta organic emission layer and at least one green organic emission layer are combined to emit white light.

The second electrode E2 may be disposed on the organic light emitting layer OL. The second electrode E2 may be a cathode that is an electron injection electrode. The second electrode E2 may be an optically reflective electrode or an optically transmissible electrode. The second electrode E2 may be disposed on the entire display area of the substrate (SUB) to cover the organic light emitting layer OL. In some implementations, the second electrode E2 may be a anode that is a hole injection electrode.

Disposition of the organic light emitting elements and the thin film transistors will be described with reference to FIG. 5.

First organic light emitting elements 10 may be disposed in the first region S110, and second organic light emitting elements 20, second thin film transistors TR2 connected to the second organic light emitting elements 20 to drive the second organic light emitting elements 20, and first thin film transistors TR1 connected to the first organic light emitting elements 10 to drive first organic light emitting elements 10, may be disposed in the second region S120. The first thin film transistors TR1 may not be formed in the first region S110, but the first organic light emitting elements 10 may be formed in the first region S110. Thus the first thin film transistors TR1 may not overlap the first region S110.

The organic light emitting elements 10 and 20 may be disposed on the substrate (SUB) in a lattice form with columns and rows. The first organic light emitting elements 10 may be disposed in a form with three or more columns and rows in the first region S110. Accordingly, a region in which three or more first organic light emitting elements 10 are continuously disposed may not overlap with the thin film transistors TR1 and TR2.

As shown in FIG. 5, the second region S120 may include an overlapped region S121 in which the second organic light emitting elements 20, the first thin film transistors TR1, and the second thin film transistors TR2 are disposed together, and a single region S122 in which only the second organic light emitting elements 20 and the second thin film transistors TR2 are disposed. In the overlapped region S121, the first thin film transistors TR1 and the second thin film transistors TR2 are overlapped with pixel areas formed by the second organic light emitting elements 20.

An interval between the thin film transistors TR1 and TR2 in the overlapped region S121 may be narrower than the interval in the single region S122. For example, there may be 120 thin film transistors TR1 and TR2 disposed in a space occupied by 100 pixel areas in the overlapped region S121. 100 thin film transistors among 120 thin film transistors may be the second thin film transistors TR2 and 20 thin film transistors thereof may be the first thin film transistor TR1. Accordingly, in the overlapped region, the first thin film transistors TR1 and the second thin film transistors TR2 are overlapped with at least one of the second organic light emitting elements 20.

As described above, only the first organic light emitting elements 10 are disposed in the first region S110, such that deterioration of the first thin film transistors TR1 may be prevented when the organic light emitting display is bent, and the first region S110 may be easily bent.

An organic light emitting display according to another exemplary embodiment will be now described with reference to FIGS. 6 and 7.

Parts that are different from the exemplary embodiment illustrated in FIGS. 1 to 5 will be described, and parts that are the same as in the exemplary embodiment illustrated in FIGS. 1 to 5 are described above with reference to FIGS. 1 to 5. For better comprehension and ease of description, the constituent elements of this exemplary embodiment that are the same as the previous exemplary embodiment will have the same reference numerals.

Figure 6:
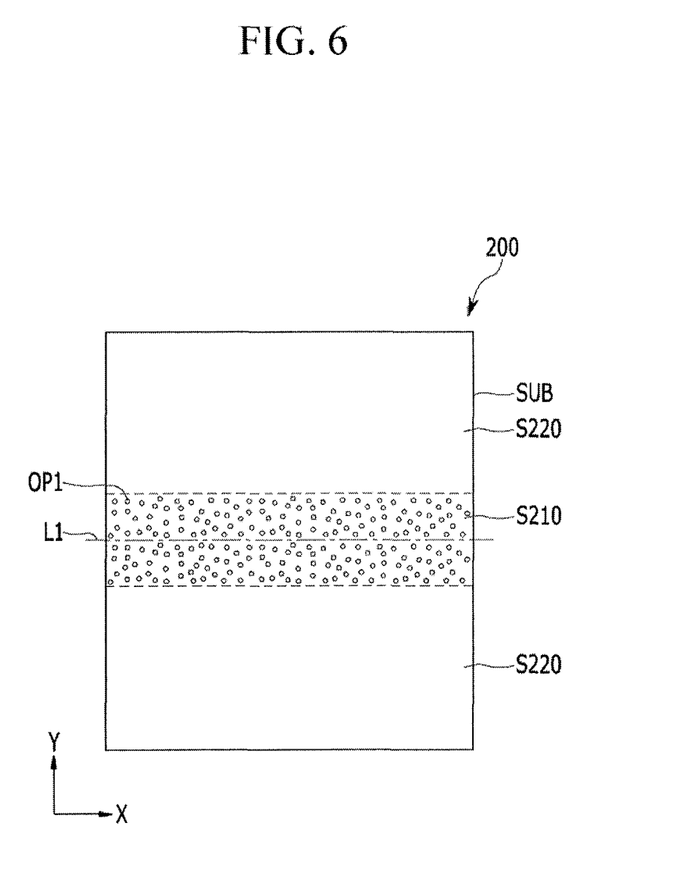
FIG. 6 illustrates a top plan view of an organic light emitting display according to another exemplary embodiment.
Figure 7:
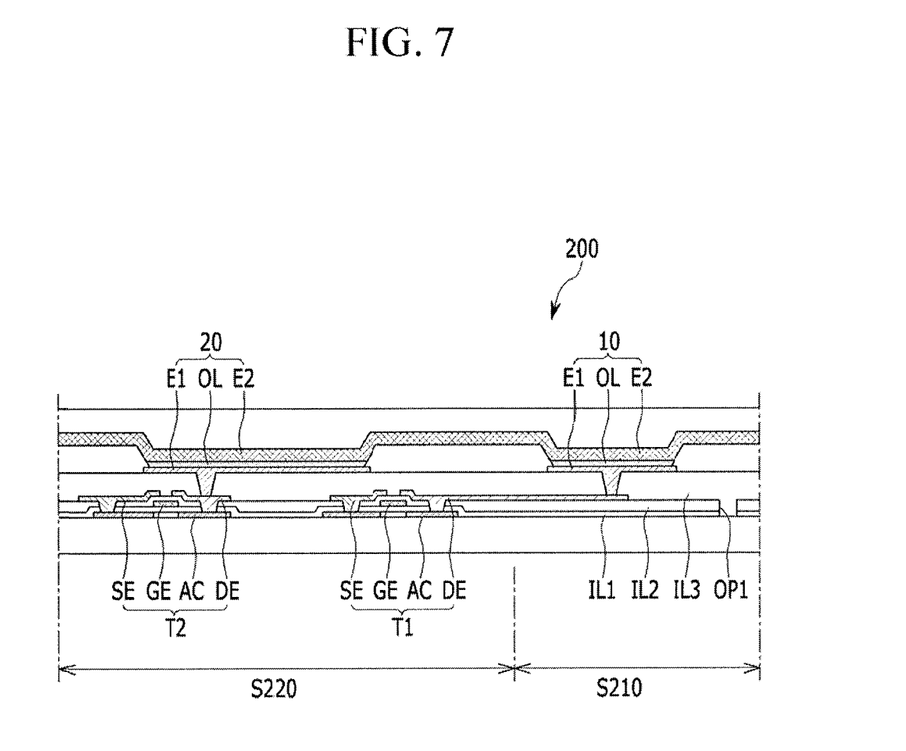
FIG. 7 illustrates a cross-sectional view of the organic light emitting display according to the exemplary embodiment illustrated in FIG. 6.

FIG. 6 illustrates a top plan view of an organic light emitting display according to this exemplary embodiment, and FIG. 7 is a cross-sectional view of the organic light emitting display illustrated in FIG. 6.

Referring to FIGS. 6 and 7, an organic light emitting display 200 according to this exemplary embodiment may include a substrate (SUB), and a plurality of organic light emitting elements 10 and 20 and thin film transistors TR1 and TR2 formed on the substrate (SUB). A first region S210 and second regions S220 may be formed on the substrate (SUB). The first region S210 may be disposed between the second regions S220 and may be formed as a bendable region. A plurality of openings OP1 may be formed in the first region S210. The openings OP1 may be formed in a first insulating layer IL1 and a second insulating layer IL2 made of an inorganic material. The openings OP1 may be formed to have a polygonal, circular, or elliptical cross-section. A third insulating layer IL3 made of an organic material may be formed on the second insulating layer IL2 to cover the openings OP1.

According to this exemplary embodiment, the plurality of openings OP1 may be formed in the first region S210. Accordingly, damage to the first insulating layer IL1 and the second insulating layer IL2 made of the inorganic material due to stress that may occur when the substrate (SUB) is bent may be minimized. In addition, the first region S210 may be easily bent. Accordingly, stress applied to the second region S220 may be decreased, thereby protecting the thin film transistors.

An organic light emitting display according to another exemplary embodiment will now be described with reference to FIGS. 8 and 9.

Parts that are different from the exemplary embodiment illustrated in FIGS. 1 to 5 will be described, and parts that are the same as in the exemplary embodiment illustrated in FIGS. 1 to 5 are described above with reference to FIGS. 1 to 5. For better comprehension and ease of description, the constituent elements of the this exemplary embodiment that are the same as the previous exemplary embodiments will have the same reference numerals.

Figure 8:
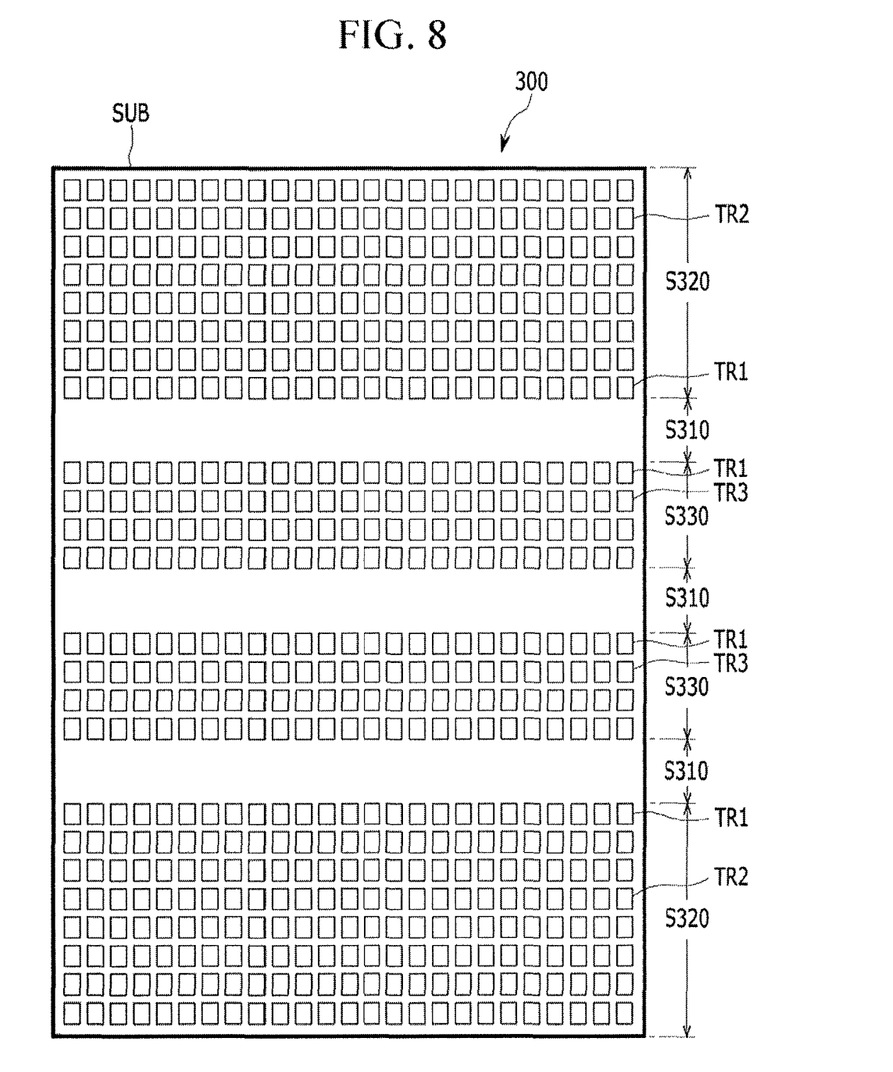
FIG. 8 illustrates a top plan view of an organic light emitting display according to another exemplary embodiment.
Figure 9:
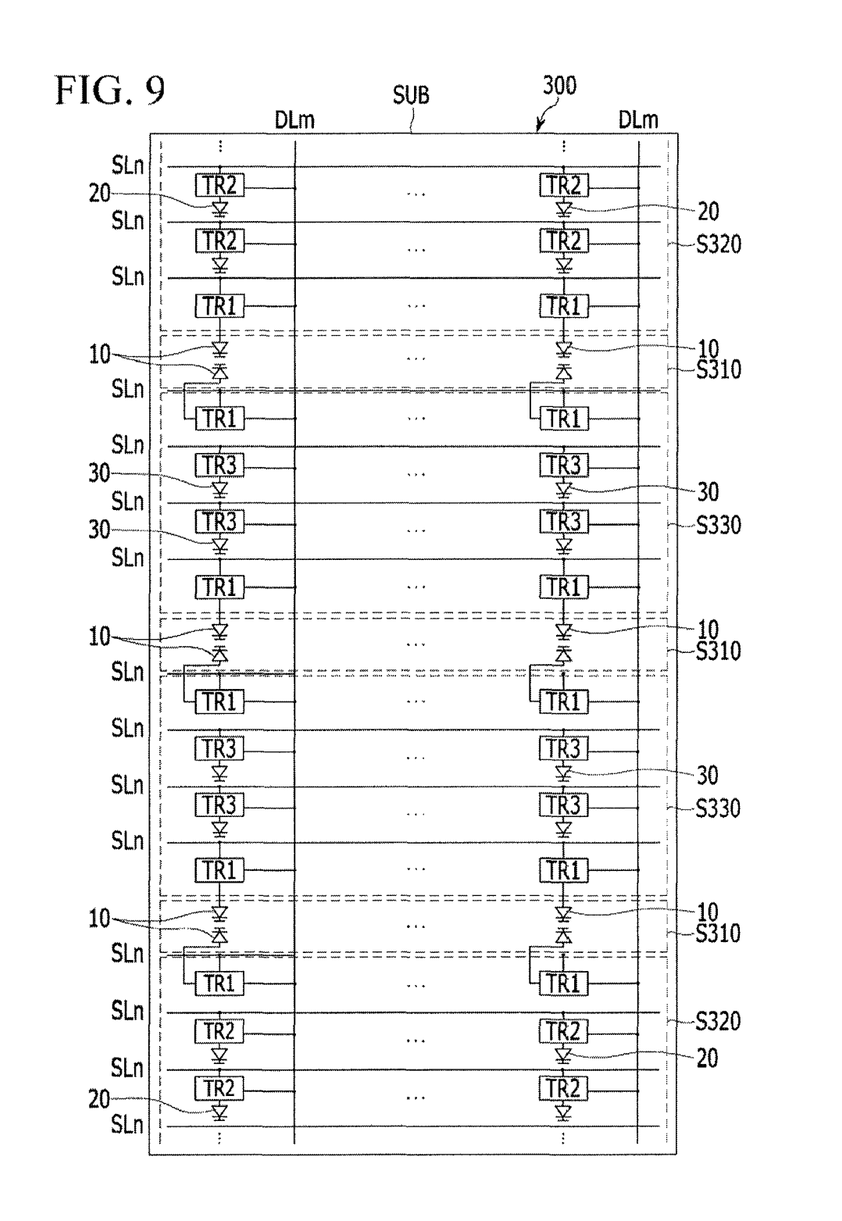
FIG. 9 illustrates a circuit diagram of the organic light emitting display according to the exemplary embodiment illustrated in FIG. 8.

FIG. 8 illustrates a top plan view of an organic light emitting display, and FIG. 9 is a circuit diagram of the organic light emitting display.

Referring to FIGS. 8 and 9, an organic light emitting display 300 according to the this exemplary embodiment includes a substrate (SUB), and a plurality of first organic light emitting elements 10, a plurality of first thin film transistors TR1, a plurality of second organic light emitting elements 20, a plurality of second thin film transistors TR2, a plurality of third organic light emitting elements 30, and a plurality of third thin film transistors TR3, which are formed on the substrate (SUB).

First regions S310, second regions S320 adjacent to the first regions S310, and third regions S330 disposed between the first regions may be formed on the substrate (SUB). For example, two second regions S320 may be formed on the substrate (SUB), and the first regions S310 and the third regions S330 may be disposed between the two second regions S320. The plurality of first regions S310 may be formed on the substrate (SUB), and the third regions S330 are disposed between the first regions S310.

The second regions S320 may be fixed by a hard frame so as to not be bendable. The first regions S310 and the third regions S330 may be foldable or bendable based on a reference line L1 passing through the center of a length direction (Y-axis direction) of the substrate (SUB). As shown in FIG. 2, the first regions S310 and the third regions S330 may be formed as bent or bendable regions, and the bent or bendable regions may be symmetrical to each other based on the reference line L1.

A plurality of scan lines SLn and data lines DLm may be formed on the substrate. The first thin film transistors TR1, the second thin film transistors TR2, and the third thin film transistors TR3 may be connected to the scan lines SLn and the data lines DLm. The first thin film transistors TR1, the second thin film transistors TR2, and the third thin film transistors TR3 may be disposed in a lattice form. The first organic light emitting elements 10, the second organic light emitting elements 20, and the third organic light emitting elements 30 may also be disposed in a lattice form.

The first organic light emitting elements 10 may be disposed in the first regions S310. Second organic light emitting elements 20, second thin film transistors TR2 connected to the second organic light emitting elements 20 to drive the second organic light emitting elements 20, and first thin film transistors TR1 connected to the first organic light emitting elements 10 to drive first organic light emitting elements 10 may be disposed in the second region S320. Third thin film transistors TR3 connected to the second organic light emitting elements 30 and the third organic light emitting elements 30 to drive the third organic light emitting elements 30, and the first thin film transistors TR1 connected to the first organic light emitting elements 10 to drive the first organic light emitting elements 10, may be disposed in the third region S330.

The first organic light emitting elements 10 may be formed in the first regions S310, and the first thin film transistors TR1 may not be formed in the first regions S310 Thus the first regions S310 may be formed to not be overlapped with the first thin film transistors TR1. The first organic light emitting elements 10 may be electrically connected to the first thin film transistors TR1 disposed in the second regions S320 or the third regions S330.

According to this exemplary embodiment, the third regions S330 may be formed between the first regions S310. Accordingly, an interval between the first organic light emitting element 10 and the first thin film transistor TR1 may decrease. In addition, the first thin film transistor TR1 may not be formed in the first region S310, thereby improving flexibility of the organic light emitting display. Further, even if third region S330 is disposed in a bendable region, the first region S310 with excellent flexibility may be bent to a relatively greater extent, and the third region S330 may be bent to a relatively lesser extent. Accordingly, deterioration of the thin film transistor disposed in the third region S330 may be minimized.

By way of summation and review, among the flat panel displays, a flexible display device may be flexible or foldable when desired by a user or in a manufacturing process. However, when a flexible display device is bent or folded, a bent or folded portion of the flexible display device may be deformed or damaged. Accordingly, the quality of the flexible display device may deteriorate. When the flexible display device is frequently bent or folded, durability and convenience of the flexible display device may deteriorate.

Embodiments advance the art by providing a flexible display device that may improve durability and convenience thereof even when subjected to repeated bending. In the flexible display device, thin film transistors may be prevented from deteriorating due to bending.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light emitting display, comprising:
   a substrate including a bendable region and an unbendable region adjacent to the bendable region;
   a plurality of first organic light emitting elements located in the bendable region and arranged in at least two rows adjacent to each other and at least two columns adjacent to each other, each of the plurality of first organic light emitting elements including a first pixel electrode and a common electrode;
   a plurality of second organic light emitting elements located in the unbendable region, each of the plurality of second organic light emitting elements including a second pixel electrode and the common electrode;
   a plurality of first thin film transistors located in the unbendable region and connected respectively to the plurality of first organic light emitting elements in the bendable region to drive the plurality of first organic light emitting elements, each of the plurality of first thin film transistors comprising a first drain electrode and a first active layer; and a plurality of second thin film transistors located in the unbendable region and connected respectively to the plurality of second organic light emitting elements in the unbendable region to drive the plurality of second organic light emitting elements, each of the plurality of second thin film transistors comprising a second active layer, wherein the first pixel electrode of at least one of the plurality of first organic light emitting elements overlaps the first drain electrode of a respective one of the plurality of first thin film transistors in the bendable region and does not overlap the first active layer of the respective one of the plurality of first thin film transistors, and the second pixel electrode of at least one of the plurality of second organic light emitting elements overlaps the first active layer of the respective one of the plurality of first thin film transistors and the second active layer of a respective one of the plurality of second thin film transistors in the unbendable region and does not overlap the first drain electrode of the respective one of the plurality of first thin film transistors.

2. The organic light emitting display as claimed in claim 1, wherein:

the first active layer, a first gate electrode and a first source electrode of each of the plurality of first thin film transistors do not extend from the unbendable region into the bendable region.

3. The organic light emitting display as claimed in claim 1, wherein:

the bendable region extends from one lateral end to another lateral end of the substrate, and the first organic light emitting elements are in a form of at least three columns adjacent to each other and at least three rows adjacent to each other.

4. The organic light emitting display as claimed in claim 1, wherein:

the unbendable region is in a form of two unbendable subregions on the substrate, and the bendable region is between the two unbendable subregions.

5. The organic light emitting display as claimed in claim 4, wherein:

the plurality of second thin film transistors are located in the two unbendable subregions, and each of the plurality of first thin film transistors and each of the plurality of second thin film transistors is overlapped by at least a corresponding one of the plurality of second organic light emitting elements.

6. The organic light emitting display as claimed in claim 5, wherein:

each of the plurality of first thin film transistors includes a first source electrode, the first drain electrode, and a first gate electrode, each of the plurality of second thin film transistors includes a second source electrode, a second drain electrode, and a second gate electrode, and the first drain electrode of at least one of the plurality of first thin film transistors is longer than the second drain electrode of at least one of the plurality of second thin film transistors.

7. The organic light emitting display as claimed in claim 6, wherein:

the first drain electrode of each of the plurality of first thin film transistors extends from the bendable region to the unbendable region.

8. The organic light emitting display as claimed in claim 1, wherein:

the bendable region is a region where stress is concentrated when the organic light emitting display is bent.

9. The organic light emitting display as claimed in claim 1, wherein:

the bendable region includes an inorganic insulating layer having openings, and an organic material insulating layer that covers the openings in the inorganic insulating layer.

10. The organic light emitting display as claimed in claim 1, wherein:

the plurality of first organic light emitting elements are a first plurality of first organic light emitting elements, the bendable region includes first bendable subregions and second bendable subregions, the first bendable subregions include the first plurality of first organic light emitting elements, and the second bendable subregions include a plurality of third organic light emitting elements and a plurality of third thin film transistors, the plurality of third thin film transistors being overlapped respectively by the plurality of third organic light emitting elements and configured to drive the plurality of third organic light emitting elements.

11. The organic light emitting display as claimed in claim 10, wherein:

the plurality of first thin film transistors are a first plurality of first thin film transistors, the organic light emitting display further comprises a second plurality of first organic light emitting elements located in the first bendable subregions, the organic light emitting display further comprises a second plurality of first thin film transistors located in the second bendable subregions and connected respectively to the second plurality of first organic light emitting elements in the first bendable subregions to drive the second plurality of first organic light emitting elements.

12. The organic light emitting display as claimed in claim 11, wherein:

each of the second bendable subregions is between two adjacent ones of the first bendable subregions.

13. The organic light emitting display as claimed in claim 1, wherein the plurality of first organic light emitting elements include different color organic light emission elements.

* * * * *